United States Patent [19]
Hiraga

[11] Patent Number: 6,064,097
[45] Date of Patent: May 16, 2000

[54] WIRING LAYERS FOR A SEMICONDUCTOR INTEGRATED CIRCUIT DEVICE

[75] Inventor: Noriaki Hiraga, Kyoto, Japan

[73] Assignee: Rohm Co., Ltd., Kyoto, Japan

[21] Appl. No.: 09/128,663

[22] Filed: Aug. 4, 1998

[30] Foreign Application Priority Data

Aug. 8, 1997 [JP] Japan ................................ 9-214442

[51] Int. Cl.[7] .......................... H01L 29/76; H01L 29/94; H01L 31/062; H01L 31/113
[52] U.S. Cl. .......................... 257/369; 257/369; 257/368; 257/367; 257/296; 257/297; 257/302
[58] Field of Search .................. 257/369, 368, 257/367, 296, 297, 302

[56] References Cited

U.S. PATENT DOCUMENTS

| | | | |
|---|---|---|---|
| 4,884,118 | 11/1989 | Hui et al. | 257/369 |
| 4,959,704 | 9/1990 | Isomura et al. | 257/368 |
| 4,982,114 | 1/1991 | Nakamura et al. | 257/369 |

*Primary Examiner*—Carl Whitehead, Jr.
*Assistant Examiner*—Matthew Warren
*Attorney, Agent, or Firm*—Nikaido Marmelstein Murray & Oram LLP

[57] ABSTRACT

A semiconductor integrated circuit device has macrocells composed of CMOS transistors. In a first wiring layer of the macrocells, a power source line coupled to the sources of P-channel MOS transistors and a ground line coupled to the sources of N-channel MOS tranistors are formed so as to extend in a first direction. In a second wiring layer of the macrocells, a power supply line connected to the power source line, a ground voltage supply line connected to the ground line, a first bias line for feeding a bias to the N well for the P-channel MOS transistors, and a second bias line for feeding a bias to a semiconductor substrate are formed recurrently so as to extend-in a second direction perpendicular to the first direction.

8 Claims, 4 Drawing Sheets
WIRING LAYERS FOR A SEMICONDUCTOR INTEGRATED CIRCUIT DEVICE

BACKGROUND OF THE INVENTION

1. Field of the Invention

The present invention relates to a semiconductor integrated circuit device having macrocells composed of CMOS transistors.

2. Description of the Prior Art

In a semiconductor integrated circuit device such as an LSI (large-scale integrated circuit), it is customary to apply a voltage to a semiconductor substrate, N well, or the like (i.e. the back gate) and adjust this voltage to compensate for variations in the threshold voltage among transistors, or to maintain the threshold voltage stably at a low level.

More specifically, in the production process of an LSI, it is in some cases inevitable that the transistors near the center of the LSI wafer and those near the periphery of the wafer have different threshold voltages, and such variations in the threshold voltage among transistors are compensated for by adjusting the voltage applied to the back gate. On the other hand, whereas reducing the power-source voltage to reduce power consumption usually leads to a slower operation speed, doing so results in a higher operation speed as long as the voltage applied to the back gate or N well is adjusted in such a way that the threshold voltage exhibits no variations and is kept at a low level.

In a conventional semiconductor integrated circuit device, two separate bias lines are laid so as to extend laterally within a macrocell: one is for the back gate, and the other is for the N well. In addition, a power-source line that is connected to the sources of P-channel MOS transistors and a ground line that is connected to the sources of the N-channel MOS transistors are also laid so as to extend laterally. These four lines are laid in a single wiring layer (specifically, in a first wiring layer).

Laying two extra bias lines in addition to the essential power-source and ground lines for each column (site) in this way means, for example in a case where there are 100 columns, adding 200 extra lines, and, in a case where there are 200 columns, adding 400 extra lines, that is, adding a huge number of extra lines. As a result, inconveniently, much of the wiring area secured for signal lines is occupied by the bias lines.

SUMMARY OF THE INVENTION

An object of the present invention is to provide a semiconductor integrated circuit device in which macrocells are fed with a sufficient bias without bias lines occupying an unduly large proportion of the wiring area for signal lines.

To achieve the above object, according to one aspect of the present invention, in a semiconductor integrated circuit device having macrocells composed of CMOS transistors, a power source line coupled to the sources of P-channel MOS transistors and a ground line coupled to the sources of N-channel MOS transistors are formed in a first wiring layer of the macrocells so as to extend in a first direction, and a power supply line connected to the power source line, a ground voltage supply line connected to the ground line, a first bias line for feeding a bias to the N well for the P-channel MOS transistors, and a second bias line for feeding a bias to a semiconductor substrate are formed recurrently in a second wiring layer of the macrocells so as to extend in a second direction perpendicular to the first direction.

In the first wiring layer, in which signal lines are also laid, only the power source line and the ground line are laid, but no bias lines are laid. Thus, the layout of the signal lines is not restricted in any way by the bias lines. On the other hand, in the second wiring layer, the power supply line, the ground voltage supply line, and the two bias lines are laid perpendicularly to the power source line and the ground line laid in the first wiring layer. Thus, it is possible to evenly distribute voltages among different columns (sites). This helps compensate for variations in the characteristics of the transistors that occur depending on the positions of the transistors within the substrate (i.e. whether they are located near the center or the periphery of the substrate).

Moreover, the power supply line, the ground voltage supply line, the first bias line, and the second bias line are formed at regular intervals and recurrently for every two to five macrocells. This makes it easy to strike a proper balance between even distribution of power-source and bias voltages among columns and minimal wiring.

According to another aspect of the present invention, in a semiconductor integrated circuit device, a power source line and a ground line for transistors are formed in a first wiring layer so as to extend in the direction of the columns of macrocells, and power supply lines for supplying voltages to the power source line, to the ground line, and to a substrate are formed in a second wiring layer so as to extend in the direction perpendicular to the direction of the columns of macrocells.

According to still another aspect of the present invention, in a logic gate pattern that is formed in a semiconductor integrated circuit device having a number of CMOS structures and that is composed of individual patterns each leading to a contact, formation of an element that serves as a part of a logic gate, such as a contact, a wiring pattern belonging to a first wiring layer, a via hole, or a wiring pattern belonging to a second wiring layer, is prohibited in a region that is located perpendicularly away from a power source line or a ground line and between transistor regions.

BRIEF DESCRIPTION OF THE DRAWINGS

This and other objects and features of this invention will become clear from the following description, taken in conjunction with the preferred embodiments with reference to the accompanied drawings in which.

DESCRIPTION OF THE PREFERRED EMBODIMENTS

Figure 1:
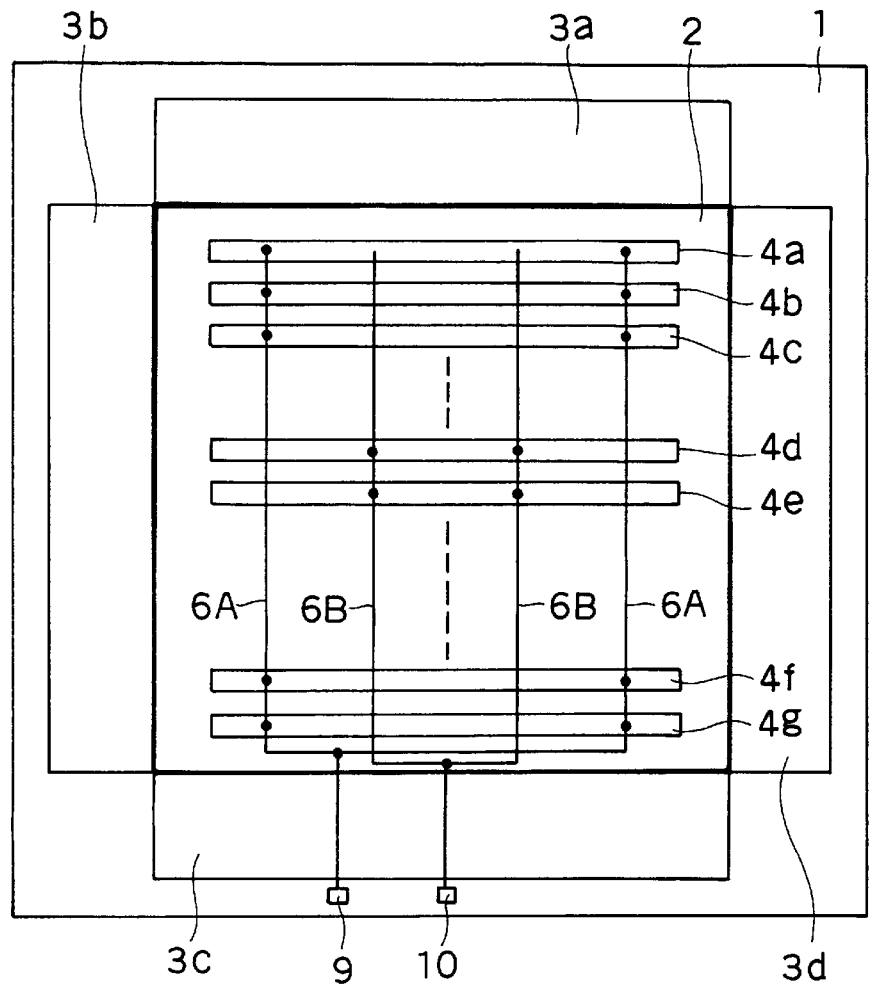
FIG. 1 is a plan view schematically illustrating the principal portion of a semiconductor integrated circuit device embodying the present invention.

Hereinafter, an embodiment of the present invention will be described with reference to the drawings. FIG. 1 illustrates a semiconductor integrated circuit device, such as an LSI, embodying the present invention. The semiconductor integrated circuit device 1 has a core section 2 and I/O sections 3a to 3d. The core section 2 is composed of a number of macrocells. The macrocells are composed of CMOS transistors, of which P-MOS transistors are formed in N wells 4a to 4g. The upper N wells 4a to 4c and the lower N wells 4f and 4g receive a bias by way of a bias line 6A.

On the other hand, the N wells 4d and 4e that are located near the center of the core section 2 receive a bias by way of another bias line 6B. The bias line 6A is connected to a bias input terminal 9, and the bias line 6B is connected to another bias input terminal 10. To these input terminals 9 and 10, different voltages are fed from the outside. Note that, although the semiconductor integrated circuit device has still another bias line for feeding a bias to its substrate, this is not shown in FIG. 1.

Figure 2:
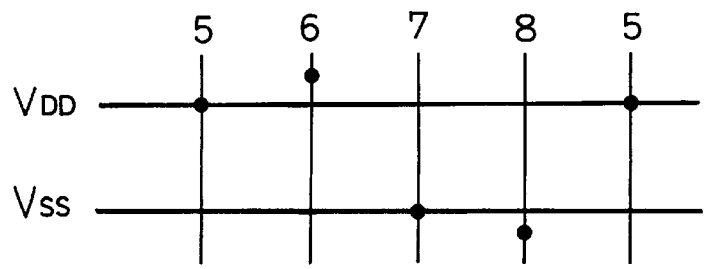
FIG. 2 is a diagram schematically illustrating the wiring structure of the semiconductor integrated circuit device of the invention.

FIG. 2 is a simplified diagram schematically illustrating the wiring structure. In FIG. 2, the power-source line $V_{DD}$ that supplies power to the sources of the P-channel MOS transistors and the ground line $V_{SS}$ that is coupled to the sources of the N-channel MOS transistors are formed in a first wiring layer. On the other hand, in a second wiring layer are formed other lines 5 to 8, of which those identified by numeral 5 are power supply lines for supplying power to the power-source line $V_{DD}$.

The line 6 is a first bias line for feeding a bias to the N wells, the line 7 is a ground voltage supply line for feeding a ground voltage to the ground line $V_{SS}$, and the line 8 is a second bias line for feeding a bias to the semiconductor substrate. These lines 5 to 8 are arranged recurrently to the right. In FIG. 2, a dot represents a node between two lines. The line 6 is coupled to the N wells, and the line 8 is coupled to the substrate. The power-source line $V_{DD}$ and the ground line $V_{SS}$ extend in the direction of the columns of the macrocells (i.e. laterally in the figure), and the lines 5 to 8 extend in the direction perpendicular to the power-source line $V_{DD}$ and the ground line $V_{SS}$.

Figure 3:
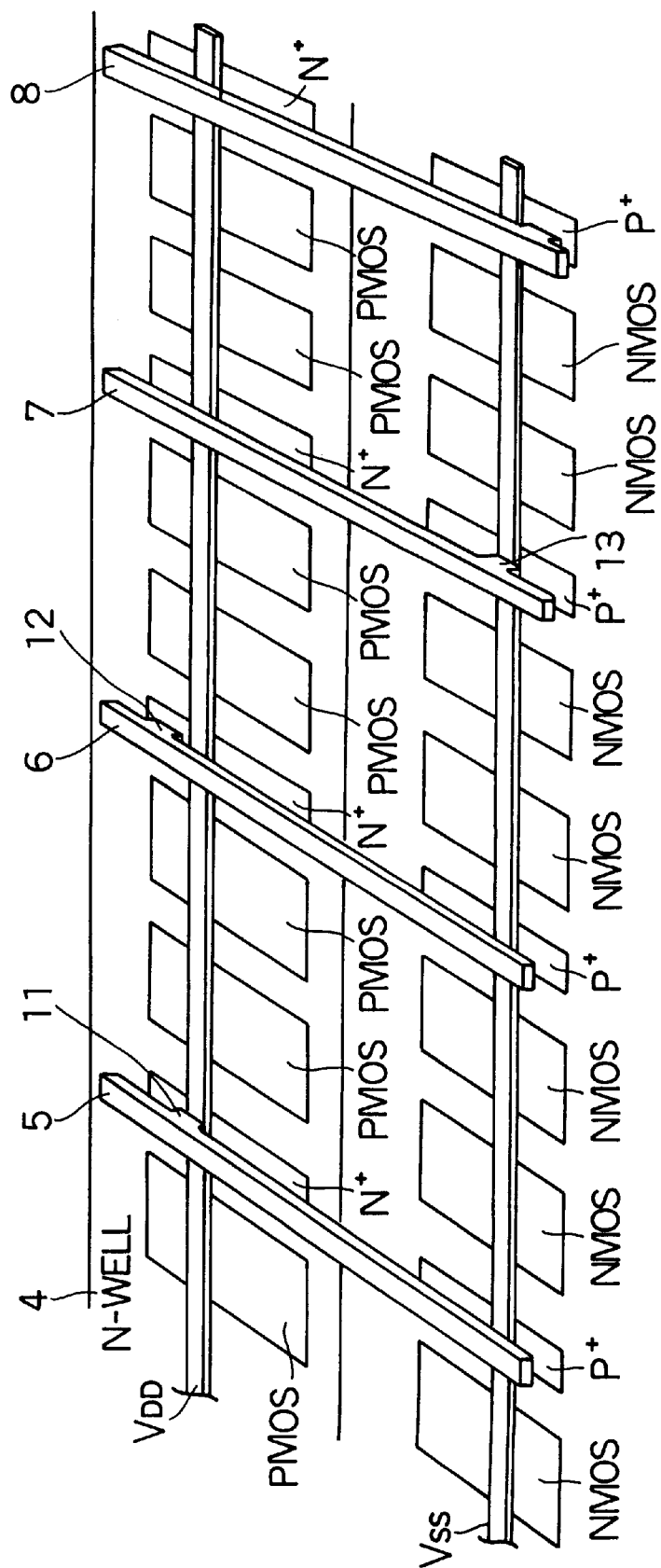
FIG. 3 is a perspective view illustrating in more detail the wiring structure shown in FIG. 2.

FIG. 3 illustrates in more detail the wiring structure shown in FIG. 2. In this figure, PMOS represents P-MOS transistor portions formed in an N well 4 formed in a P⁻ substrate, and N⁺ represents N⁺ layers formed in the N well 4 for connection to the above-mentioned lines.

NMOS represents N-MOS transistor portions, and P⁺ represents P⁺ layers for connecting the P⁻ substrate to the above-mentioned lines. The power supply line 5 is, at a joint 11, coupled to the power-source line $V_{DD}$; it is not coupled to the N⁺ layer. The line 6 is, at a joint 12, kept in contact with the N⁺ layer. The ground voltage supply line 7 is, at a joint 13, coupled to the ground line $V_{SS}$. This line 7 is not coupled to the P⁺ layer. The line 8 is coupled to the P⁺ layer to feed a bias to the P⁻ substrate.

Suppose that the macrocells are so formed that a single unit thereof is composed of eight, i.e. four P-MOS and four N-MOS, transistors. Then, the lines 5 to 8, which are formed in the second wiring layer in the example shown in the figure, are so formed as to recur for every two macrocells. To evenly distribute various voltages among the macrocells within the core section 2, it is preferable that the lines 5 to 8 be so formed as to recur for every two to five macrocells.

Figure 4:
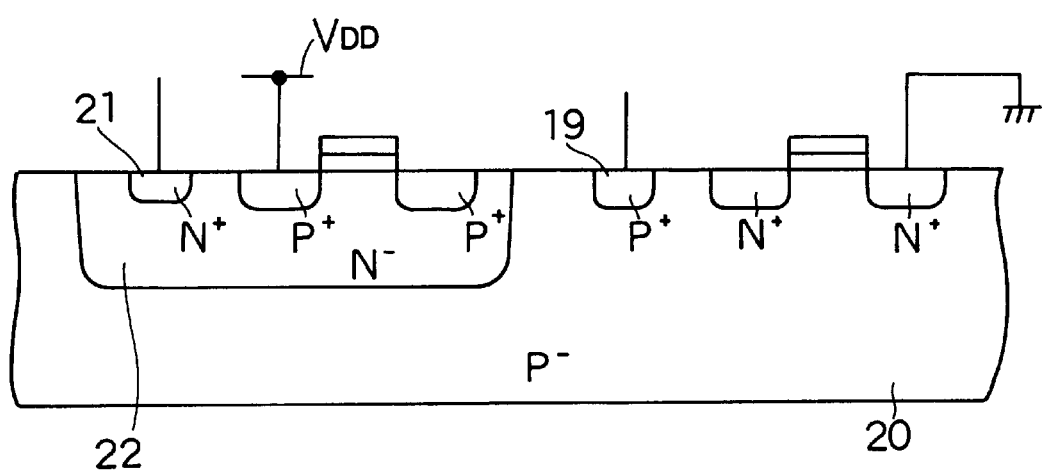
FIG. 4 is a diagram illustrating the structure of a semiconductor integrated circuit device, in explanation of the back-gate bias.

In FIG. 4, the voltage applied to the substrate 20 by way of the P⁺ layer 19 is below 0 V, typically in the range from −2 to 0 V. The voltage applied to the N well 22 by way of the N⁺ layer 21 is higher than the power-source voltage on the power-source line $V_{DD}$.

Figure 5:
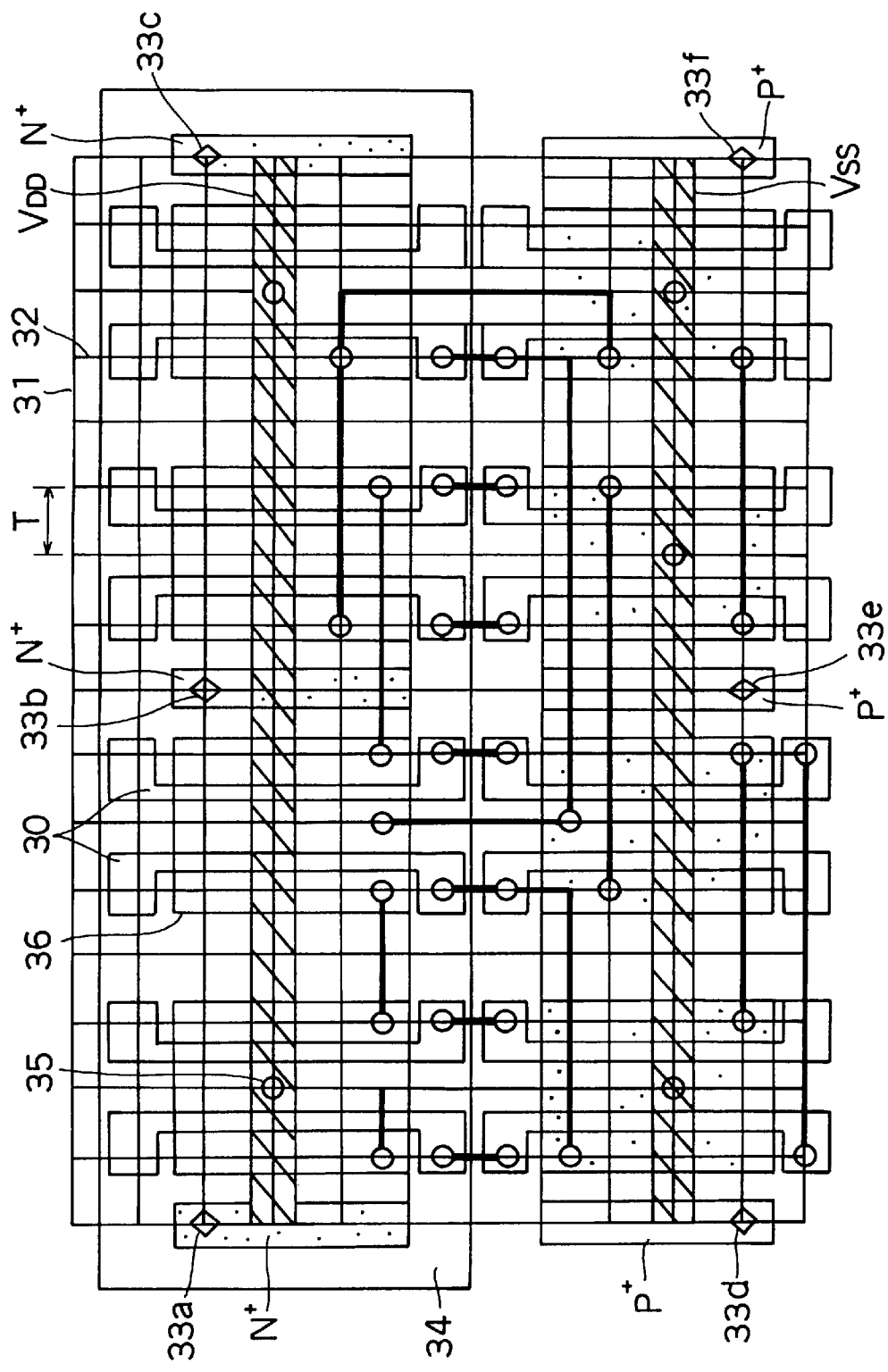
FIG. 5 is a plan view illustrating a logic gate pattern embodying the present invention.

FIG. 5 illustrates an example of the pattern of a logic gate applicable to the semiconductor integrated circuit device shown in FIGS. 1 to 4. This logic gate is composed of individual patterns each leading to a contact, and its circuit scale is approximately comparable with that of an inverter (containing two transistors) to that of a flip-flop (containing 30 transistors).

In FIG. 5, numeral 36 represents transistor portions, and numeral 30 represents gate electrodes made of polysilicon. Thus, each transistor portion 36 contains two transistors. Numeral 34 represents an N well for the P-MOS transistors. N⁺ represents an N⁺ layer for connecting the N well 34 to the previously-mentioned lines, and P⁺ represents a P⁺ layer for connecting the substrate to those lines.

$V_{DD}$ and $V_{SS}$ represent the power-source line and the ground line, both extending laterally. Numerals 33a to 33c represent regions formed one grid pitch outward from the power-source line $V_{DD}$, and numerals 33d to 33f represent regions formed one grid pitch outward from the ground line $V_{SS}$. In these regions 33a to 33f, formation of an element that serves as a part of the logic gate, such as a contact hole, a wiring pattern belonging to the first wiring layer, a via hole, or a wiring pattern belonging to the second wiring layer, is prohibited.

Numerals 31 and 32 represent laterally and longitudinally extending lines that form a grid composed of a large number of grid lines. These lines 31 and 32 are used to aid the designing of the layout of the LSI, and the distance T from one intersection to the next is referred to as the grid pitch.

The structure of the logic gate prohibits formation of a contact hole, a via hole, or a wiring pattern belonging to the first or second wiring layer in the above-mentioned regions 33a to 33f. However, this does not necessarily mean that formation of a contact or the like for feeding a bias to the back gate (i.e. the substrate and the N well) shown in FIGS. 1 to 4 is also prohibited. Rather, exactly because the structure of the logic gate prohibits formation of a contact hole, a via hole, or a wiring pattern belonging to the first or second wiring layer in the regions 33a to 33f, these regions 33a to 33f can be used to form a contact or the like for feeding a bias to the back gate (i.e. the substrate and the N well).

The pattern shown in FIG. 5 yields the same function regardless of on which of the lines 5 to 8 shown in FIG. 3 it is arranged using the region 33d as its origin. This pattern can be applied also to a semiconductor integrated circuit device that has no back gate and in which the regions 33a to 33f shown in FIG. 5 are not used for bias coupling. Although the regions 33a to 33f are located one grid pitch outward from the power-source and ground lines in the above-described example, they may be located two grid pitches outward, or even inward, from the power-source and ground lines.

According to the above-described embodiment, in a first wiring layer in which signal lines are laid, a power-source line and a ground line are laid, but no bias lines are laid. As a result, the layout of the signal lines is not restricted by the bias lines. Moreover, in a second wiring layer, a power supply line, a ground voltage supply line, and two bias lines are laid perpendicularly to the power-source line and the ground line laid in the first wiring layer. As a result, voltages can be distributed evenly among columns (sites). This helps compensate for variations in the characteristics of the transistors that arise depending on the positions of the transistors within the substrate (i.e. whether they are placed near the center or near the periphery of the substrate).

Moreover, a power supply line, a ground voltage supply line, a first bias line, and a second bias line are arranged at regular intervals and recurrently for every two to five macrocells. This makes it easy to strike a proper balance between even distribution of power-source and bias voltages among columns and minimal wiring.

Moreover, a logic gate pattern can be flexibly applied to various types of semiconductor integrated circuits, and this makes it possible to produce semiconductor integrated circuit devices accordingly effectively. In addition, this logic gate pattern can be applied also to a semiconductor integrated circuit device having no back gate.

What is claimed is:

1. A semiconductor integrated circuit device having macrocells composed of CMOS transistors, wherein, in a first wiring layer of said macrocells, a power source line coupled to sources of P-channel MOS transistors and a ground line coupled to sources of N-channel MOS transistors are formed so as to extend in a first direction, and wherein, in a second wiring layer of said macrocells, a power supply line connected to said power source line, a ground voltage supply line connected to said ground line, a first bias line for feeding a bias to an N well for the P-channel MOS transistors, and a second bias line for feeding a bias to a semiconductor substrate are formed recurrently so as to extend in a second direction perpendicular to said first direction.

2. A semiconductor integrated circuit device as claimed in claim 1, wherein said power supply line, said ground voltage supply line, said first bias line, and said second bias line are formed at regular intervals and recurrently for every two to five macrocells.

3. A semiconductor integrated circuit device, wherein, in a first wiring layer, a power source line and a ground line for transistors are formed so as to extend in a direction of a column of macrocells and, in a second wiring layer, power supply lines for supplying voltages to said power source line, to said ground line, and to a substrate are formed so as to extend in a direction perpendicular to said direction of a column of macrocells.

4. A logic gate pattern that is formed in a semiconductor integrated circuit device having a number of CMOS structures and that is composed of individual patterns each leading to a contact, wherein formation of an element that serves as a part of a logic gate, such as a contact, a wiring pattern belonging to a first wiring layer, a via hole, or a wiring pattern belonging to a second wiring layer, is prohibited in a region that is located perpendicularly away from a power source line or a ground line and between transistor regions.

5. A semiconductor integrated circuit device comprising:

a core region;

I/O regions formed around said core region;

a plurality of macrocells composed of CMOS transistors and formed in said core region;

a power source line coupled to sources of P-channel MOS transistors of said macrocells;

a ground line coupled to sources of N-channel MOS transistors of said macrocells;

a power supply line connected to said power source line;

a first bias line for feeding a bias to an N well for said P-channel MOS transistors; and a second bias line for feeding a bias to a semiconductor substrate, wherein said power source line and said ground line are formed in a first wiring layer so as to extend in a first direction, and said power supply line, said ground voltage supply line, and said first and second bias lines are formed in a second wiring layer so as to extend in a second direction perpendicular to said first direction.

6. A semiconductor integrated circuit device as claimed in claim 5, wherein, within each CMOS transistor, a P-channel MOS transistor and an N-channel MOS transistor are so formed as to be arranged along said first direction, and a plurality of such CMOS transistors are so formed as to be arranged along said second direction.

7. A semiconductor integrated circuit device as claimed in claim 6, wherein one macrocell is composed of a predetermined number of CMOS transistors.

8. A semiconductor integrated circuit device as claimed in claim 7, wherein said power supply line, said ground voltage supply line, said first bias line, and said second bias line are formed at regular intervals and recurrently for every two to five macrocells.

* * * * *